(12) United States Patent
Schaerer et al.

(10) Patent No.: US 6,175,502 B1
(45) Date of Patent: Jan. 16, 2001

(54) EQUIPMENT ARRANGEMENT

(75) Inventors: Erwin Schaerer, Langenau; Peter Mueller, Grosshelfendorf; Christian Keil, Pischertshofen; Alexander Klein, Fuerstenfeldbruck, all of (DE)

(73) Assignee: Knuerr-Mechanik fuer die Elektronik Aktiengesellschaft, Munich (DE)

( * ) Notice: Under 35 U.S.C. 154(b), the term of this patent shall be extended for 0 days.

(21) Appl. No.: 09/253,070

(22) Filed: Feb. 19, 1999

(30) Foreign Application Priority Data

Feb. 20, 1998 (DE) .............................. 198 07 234

(51) Int. Cl.[7] ................. G06F 1/16; H05F 5/10
(52) U.S. Cl. ............ 361/727; 361/680; 361/681; 361/724; 361/725; 312/223.1; 312/223.2; 312/223.6
(58) Field of Search .................. 361/683, 680, 361/681, 727, 724, 725, 726; 312/223.1–223.7

(56) References Cited

U.S. PATENT DOCUMENTS

| | | | | |
|---|---|---|---|---|
| 5,196,993 | * | 3/1993 | Herron et al. | 361/822 |
| 5,388,032 | | 2/1995 | Gill et al. | 361/681 |
| 6,078,495 | * | 6/2000 | Cipolla et al. | 361/680 |

* cited by examiner

*Primary Examiner*—Leo P. Picard
*Assistant Examiner*—Hung Van Duong
(74) *Attorney, Agent, or Firm*—Evenson, McKeown, Edwards & Lenahan, P.L.L.C.

(57) ABSTRACT

An equipment arrangement for switch, computer and server cabinets or racks comprises a monitor/flat screen, a keyboard and a signal switch in a common slide-in module or in two individual slide-in modules. The monitor/flat screen can be pivoted up or folded out in an extracted operating position. In the case of a module having one height unit of the 19 inch design the signal switch is positioned between the keyboard and the monitor/flat screen. In the case of a common module with a height of approximately two height units or two separate modules having in each case a maximum height of one height unit, the keyboard and signal switch are located in one plane and above the latter is located a monitor/flat screen.

11 Claims, 2 Drawing Sheets

EQUIPMENT ARRANGEMENT

1. FIELD OF THE INVENTION

The invention relates to an equipment arrangement for cabinets in network technology with at least one slide-in module for a keyboard, a monitor and a device for controlling a computer or server.

2. DESCRIPTION OF RELATED ART

For cabinets in network and automation technology and in particular for switch, computer and server cabinets it is known to place keyboards in slide-in modules, which are horizontally adjustable by means of telescopic rails and which can be extracted for data entry.

Generally a keyboard module has a height of one height unit (HU) of the 19 inch design. In addition, in computer and server cabinets there must be a further slide-in module for a signal switch, which permits a separate control of several computers or servers. The signal switch module generally has a height of one to three height units. At least one visual display unit is also required in a computer or server cabinet.

U.S. Pat. No. 5,388,032 discloses an equipment arrangement for a computer cabinet having several computers, in which a keyboard and a flat screen as a visual display unit are located in a slide-in module, which has a height of one height unit of the 19 inch design. Between the keyboard in a front area of the module and the flat screen in a rear area of the module is formed a partition. A discriminator for the selection of a computer is placed behind the flat screen.

The discriminator, which is controlled by a selector unit, connects the keyboard and the flat screen to the selected computer. The selector unit can be constituted by the keyboard, but also by a keypad or a rotary switch, which are then positioned behind the partition and in the vicinity of the flat screen.

The rear arrangement of the discriminator can be disadvantageous, e.g. for conversion and maintenance work. The complicated, separate arrangement of the selector unit and the discriminator in front of and behind the adjustable flat screen is also disadvantageous.

3. SUMMARY OF THE INVENTION

The object of the invention is to create an equipment arrangement which permits a particularly advantageous arrangement of a keyboard as an input unit, a monitor/flat screen as the visual display unit and a device for controlling and selecting a computer or server in a computer or server cabinet, which simultaneously increases the usable cabinet volume and ensures an easy operation of the equipment assembly and the server or computer.

According to the invention, this object is achieved by an equipment arrangement with a keyboard, a monitor/flat screen and a device for controlling and selecting a computer and/or server, in which the device for controlling and selecting a computer and/or server is a signal switch. In the case of a common slide-in module having one height unit, the signal switch is positioned between the keyboard and the monitor/flat screen, the keyboard being located in a front area and the monitor/flat screen in a rear area of the slide-in module. As the signal switch is positioned between the keyboard and the flat screen, a reliable, troublefree connection between the keyboard, signal switch and monitor/flat screen is possible. According to the invention the keyboard and monitor/flat screen can also be placed in a common slide-in module with a height of 1.5 to 2 height units or in each case in an individual module with a height of in each case approximately one height unit, the monitor/flat screen being located in the common module having approximately two height units above the keyboard. In the case of single or individual slide-in modules for the keyboard and monitor/flat screen, they can be directly superimposed or be arranged with a spacing of one or more height units.

In the slide-in position of the slide-in module, the keyboard, monitor/flat screen and signal switch are received by each module respectively. In the extracted or slide-out operating position, the monitor/flat screen can be inclined or vertical.

The term monitor/flat screen covers screens of limited construction depth, e.g. flat picture tubes with cathode ray deflection, scanning flat screens, plasma, LED, electroluminescent and LCD screens. Generally a flat screen has a depth of approximately 24 mm. Said flat screen is placed in a horizontal position, e.g. behind the keyboard and the signal switch or above the keyboard and when the slide-in module is extracted it is brought into an operating position, e.g. being folded out or put upright or pivoted up about a horizontal, preferably front axis.

In the almost vertical operating position the monitor/flat screen should be secured by an end stop. It is also appropriate to secure the slide-in module against unintentional sliding in. It is advantageous if one device ensures both the retention of the monitor/flat screen in the operating position and also the stopping of the module in the slid-out position.

The arrangement of a keyboard, a signal switch and a flat screen in one place, as well as advantageously a handrest in a front area of the common slide-in module requires an approximate cabinet depth or module depth of roughly 700 mm. Such a module depth exists with computer cabinets in the server sector.

In the case of a common slide-in module of 1.5 to max 2 height units of the 19 inch design for a keyboard and a flat screen positioned above it, appropriately the signal switch is located behind the keyboard. A handrest can be located in front of the keyboard. The flat screen is appropriately articulated to a rear joint or hinge and can be folded out. Generally the angle in the folded out operating position is up to approximately 130°. This equipment layout or arrangement merely requires a depth of approximately 300 to 400 mm.

A keyboard and a monitor/flat screen can also be placed in two individual slide-in modules. It is advantageous to locate a signal switch in the individual module for the keyboard. The signal switch can be arranged directly behind the keyboard, but also in side areas and in a vertical arrangement.

The individual slide-in modules, which have a height of one height unit (1 HU), can be directly superimposed in a cabinet or rack. However, the possibility also exists of spacing the individual modules by one or more height units.

Particularly in the variant with a common slide-in module of roughly one or two height units, a monitor/flat screen can be removed from the common module for the operating position and placed on a higher holding fixture or an extraction plate.

It is also advantageous if the monitor/flat screen module also contains a device for pivoting the monitor/flat screen about a vertical axis. This pivoting device can e.g. be placed in swing-down manner in a side area of the module. It can also be advantageous if, besides the vertical adjustment, there is a slope adjustment for the monitor/flat screen.

4. BRIEF DESCRIPTION OF THE DRAWINGS

The invention is described in greater detail hereinafter relative to the attached diagrammatic drawings, wherein FIG. 1 is a plan view of an equipment arrangement according to the invention.

5. DESCRIPTION OF PREFERRED EMBODIMENTS

Figure 1:
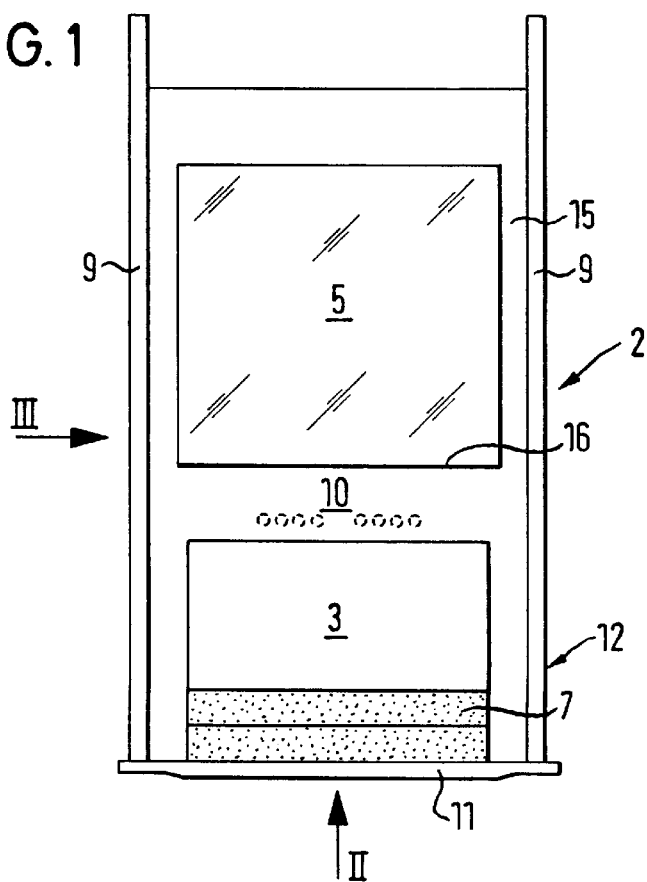
Figure 2:
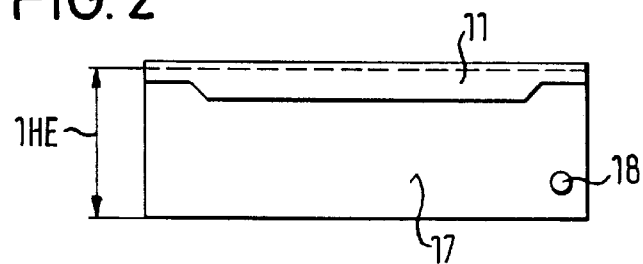
FIG. 2 is a view of the equipment arrangement according to the invention along arrow II in FIG. 1.
Figure 3:
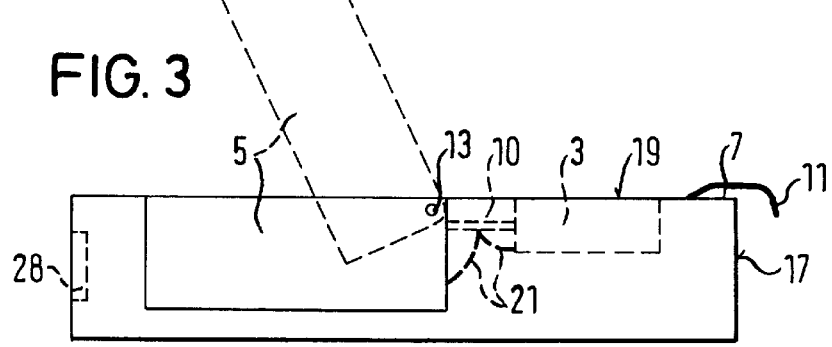
FIG. 3 is a side view of the equipment arrangement according to the invention along arrow III in FIG. 1, but with a raised flat screen.

FIGS. 1 to 3 show a preferred variant of the equipment arrangement according to the invention. This equipment assembly has a keyboard 3, a signal switch 10 and as a visual display unit a monitor/flat screen 5 in a common slide-in module 2. The common module 2 has a height of approximately one height unit and a depth of approximately 700 mm.

The keyboard 3 is located in a front area 12 of the module 2. Behind it is located the signal switch 10 and behind the latter the monitor/flat screen 5 (e.g. a LCD). A handrest 7 is formed as a part of a front handle 11 or between the front handle 11 and a keyboard 3. All the aforementioned means 3, 5, 10 and also the handrest 7 do not extend beyond an upper edge 19 of the common slide-in module 2 (cf. FIG. 3).

In this embodiment a locking device, e.g. a lock cylinder 18 is provided in a front side 17 of the common module 2 in order to prevent an unauthorized sliding out of the module 2 and an unauthorized data input and output.

The common slide-in module 2 is horizontally adjustable by means of bilateral telescopic rails 9 and can be slid out and then slid in to a cabinet or rack (not shown). The keyboard 3, signal switch 10 and monitor/flat screen 5 are accessible in the extracted position.

FIG. 3 indicates by broken lines an operating positon of the monitor/flat screen 5, in which the latter is brought out of the horizontal arrangement by swinging up. The raising of the flat screen 5 can take place relatively easily avout a front, horizontal axis 13. A wiring 21 leads from the signal switch 10 to the flat screen 5 and keyboard 3.

Figure 4:
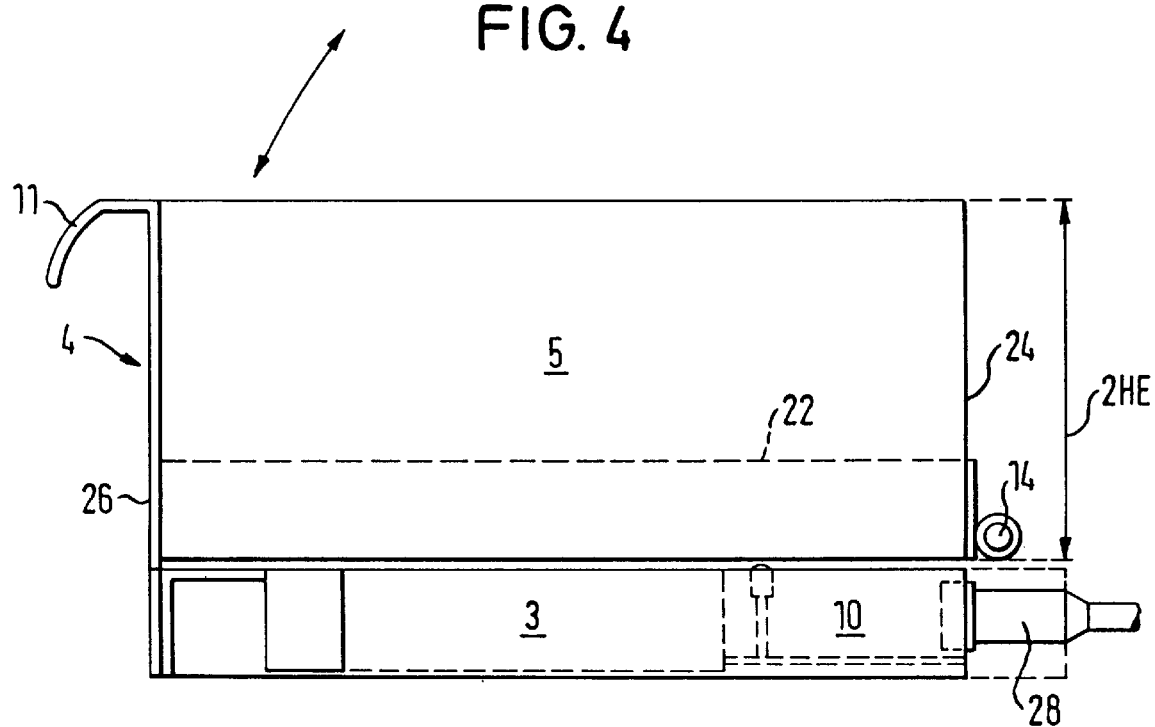
FIG. 4 is a side view of another equipment arrangement.

FIG. 4 shows a further equipment arrangement in a common slide-in module 4, which in this case has a height of two height units. A keyboard 3 and a signal switch 10 have a height of <1 HU. A broken line 22 indicates one height unit (1 HU).

The flat screen 5 is positioned above the keyboard 3 and signal switch 10 and is articulated in a rear area 24 of the module 4 by means of a hinge 14. The flat screen 5 can be placed in a folded out position with an opening angle of approximately 130° and ensures good readability. In a front area 26 and in front of the keyboard 3 is formed a handrest 7, which like the keyboard 3 and signal switch 10 is covered by the folded over flat screen 5 when the common module 4 is operable by means of a handle 11, which following unlocking (not shown) can also be used for folding out the flat screen 5. A connection 28 for the signal switch 10 is located on the rear area 24.

Figure 5:
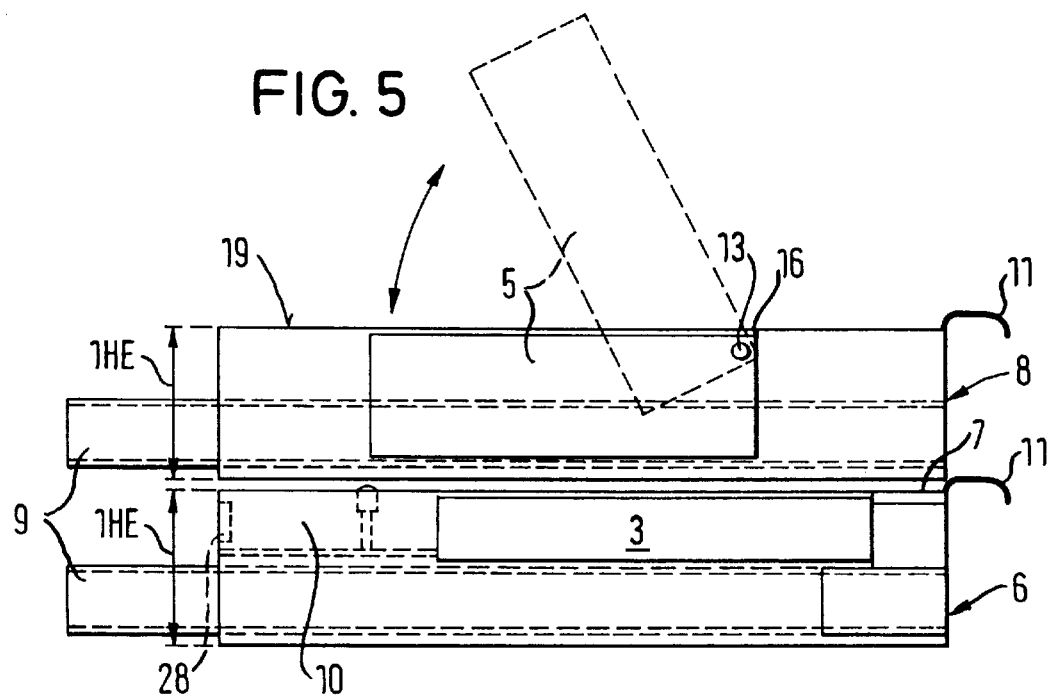
FIG. 5 is a highly diagrammatic side view of a further equipment arrangement according to the invention.

A further equipment arrangement is shown in FIG. 5. Identical features are once again given identical reference numerals.

In the equipment arrangement according to FIG. 5 one individual module 6 is provided for a keyboard 3 and another individual module 8 for a flat screen 5. Behind the keyboard 3 is once again located a signal switch 10 with a connection 28. A handrest 7 is formed in front of the flat screen 5. The individual modules 6, 8 have in each case a height of approximately one height unit and, according to FIG. 5, can be directly superimposed, but also arranged in a spaced manner in a cabinet or rack. The flat screen 5 can also be removed from the slide-in module 8 and placed on another, particularly higher plane of a cabinet.

What is claimed is:

1. Equipment arrangement for cabinets and racks of network and automation technology, in which several computers or servers are located, comprising:

at least one slide-in module, in which a keyboard, a monitor/flat screen and a device for controlling a computer or server are arranged, said monitor flat screen being adjustable from a horizontal position with a slide-in module into a vertical or sloping operating position with the module slide-out, wherein said device for controlling the computer and/or server is a signal switch, wherein the keyboard, the monitor/flat screen and the signal switch are located in a common slide-in module with a height of approximately one height unit of a 19 inch design, in which the keyboard is located in a front area, the monitor/flat screen is located in a rear area of the module and the signal switch is located between the keyboard and the monitor/flat screen or the keyboard and the monitor/flat screen are placed in a common slide-in module with a height of approximately two height units of the 19 inch design or in each case in an individual module with a height of in each case approximately one height unit of the 19 inch design, wherein, in a common module of approximately two height units, the monitor/flat screen is positioned above the keyboard, and wherein the individual modules for the keyboard and the monitor/flat screen are directly superimposed or arranged with a spacing of one or more height units.

2. Equipment arrangement according to claim 1, wherein the monitor/flat screen of the common slide-in module having a height of approximately two height units can be folded about a hinge, which is located at a rear area and wherein a horizontal axis of the monitor/flat screen of the common module with a height of one height unit and the individual module is located on a front area of the monitor/flat screen.

3. Equipment arrangement according to claim 2, wherein the monitor/flat screen can at least be folded out or is pivotable about the horizontal axis.

4. Equipment arrangement according to claim 2, wherein the monitor/flat screen of the common slide-in modules and the individual slide-in module in the operating position outside and in particular above the slide-in module is placed on an extraction plate or a holding fixture.

5. Equipment arrangement according to claim 2, wherein the common slide-in modules and at least the individual slide-in module for the monitor/flat screen has a device for securing the modules in the extended position and the vertical or inclined monitor/flat screen.

6. Equipment arrangement according to claim 3, wherein, after raising, the monitor/flat screen can be pivoted about a vertical axis and/or inclined.

7. Equipment arrangement according to claim 1, wherein in the common slide-in module with a height of approximately two height units and in the individual slide-in module for the keyboard, behind the latter is in each case provided a signal switch.

8. Equipment arrangement according to claim 1, wherein the signal switch is located alongside the keyboard and in the marginal areas of the slide-in modules which receive said keyboard.

9. Equipment arrangement according to claim 1, wherein the slide-in modules with keyboard have a handrest, which is positioned in front of the keyboard in a front area.

10. Equipment arrangement according to claim 2, wherein the common slide-in module with successively arranged keyboard, signal switch and monitor/flat screen has a depth of approximately 700 mm.

11. Equipment arrangement according to claim 2, wherein the common slide-in module with a height of approximately two height units and the individual slide-in modules have a depth of approximately 300 to 400 mm.

* * * * *